(12) United States Patent
Mengel et al.

(10) Patent No.: US 8,021,919 B2
(45) Date of Patent: Sep. 20, 2011

(54) METHOD OF MANUFACTURING A SEMICONDUCTOR DEVICE

(75) Inventors: Manfred Mengel, Bad Abbach (DE); Thomas Spoettl, Mintraching (DE); Frank Pueschner, Kelheim (DE); Louis Vervoort, Pielenhofen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/415,770

(22) Filed: Mar. 31, 2009

(65) Prior Publication Data

US 2011/0003440 A1    Jan. 6, 2011

(51) Int. Cl.
*H01L 21/44* (2006.01)
(52) U.S. Cl. . 438/106; 438/127; 257/777; 257/E21.499; 257/E21.506
(58) Field of Classification Search .................. 438/106, 438/127; 257/777, E21.499, E21.506
See application file for complete search history.

(56) References Cited

U.S. PATENT DOCUMENTS

| 5,260,108 | A | 11/1993 | Braren et al. |
| 5,492,861 | A | 2/1996 | Opower |
| 6,319,564 | B1 | 11/2001 | Naundorf et al. |
| 2005/0224092 | A1 | 10/2005 | Schildmann |
| 2009/0079090 | A1* | 3/2009 | Pressel et al. .................. 257/777 |
| 2010/0001291 | A1* | 1/2010 | Otremba et al. ................. 257/77 |
| 2010/0297810 | A1 | 11/2010 | Otremba et al. |

FOREIGN PATENT DOCUMENTS

| DE | 157989 A3 | 12/1982 |
| EP | 1367872 A2 | 12/2003 |
| WO | 9844165 | 10/1998 |
| WO | 02074027 A1 | 9/2002 |

* cited by examiner

*Primary Examiner* — Hsien-ming Lee
(74) *Attorney, Agent, or Firm* — Dicke, Billig & Czaja, PLLC (57) ABSTRACT

A method of manufacturing a semiconductor device or a substrate is described. The method includes providing a chip attached to a carrier or providing a substrate. A foil is held over the chip and the carrier or the substrate. A laser beam is directed onto the foil, and substance at the foil is ablated and deposited on the chip and the carrier or on the substrate.

19 Claims, 11 Drawing Sheets

METHOD OF MANUFACTURING A SEMICONDUCTOR DEVICE

BACKGROUND

The invention relates to the technology of manufacturing semiconductor devices or substrates, and more particularly to a method of manufacturing a semiconductor device or a substrate by using laser processing.

Structured metallization layers such as conductive paths or circuit interconnections are widely used for signal routing and powering of electronic devices. In many applications, it is desirable to provide for a versatile and cost-effective method to apply structured metallization layers to semiconductor devices or substrates.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the following detailed description, aspects and embodiments are now described with reference to the drawings, wherein like reference numerals or reference numerals having the same last two digit numbers are generally utilized to refer to like or corresponding elements throughout. For purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the Figures are not necessarily to scale.

In the following detailed description, reference is made to the accompanying drawings, which form a part thereof, and in which is illustrated by way of illustration specific embodiments in which the invention may be practiced. In this regard, directional terminology, such as "upper", "lower", "left-hand", "right-hand", "front side", "backside", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As used in this specification, the terms "coupled" and/or "electrically coupled" do not meant that the elements must be directly coupled together; intervening elements may be provided between the "coupled" or "electrically coupled" elements.

Embodiments of manufacturing a semiconductor device may comprise providing a chip attached to a carrier. The semiconductor chips described herein may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor wafers and chips may include control circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its front side and backside. By way of example, the source electrode and gate electrode of a power MOSFET may be situated on one main surface, while the drain electrode of the power MOSFET may be arranged on the other main surface. Furthermore, the devices described below may include integrated circuits to control the integrated circuits of other semiconductor chips, for example the integrated circuits of power semiconductor chips. The semiconductor chips described herein may be manufactured from any specific semiconductor material, for example Si, SiC, SiGe, GaAs, etc., and, furthermore, may contain inorganic and/or organic materials that are not semiconductors, such as for example insulators, plastics or metals.

Furthermore the semiconductor chips described below may comprise contact elements or contact pads on one or more of their outer surfaces wherein the contact elements serve for electrically contacting the semiconductor chips. The contact elements may have the form of lands, i.e., flat contact layers on an outer surface of the semiconductor chip. The metal layer(s) of which the contact elements are made may be manufactured with any desired material composition. Any desired metal or metal alloy, for example aluminum, titanium, gold, silver, copper, palladium, platinum, nickel, chromium or nickel vanadium, may be used as a layer material. The metal layer(s) need not be homogenous or manufactured from just one material, that is to say various compositions and concentrations of the materials contained in the metal layer(s) are possible. The contact elements may be situated on the active main surfaces of the semiconductor chips or on other surfaces of the semiconductor chips.

Carriers described below may comprise any kind of carriers for supporting a semiconductor chip, in particular carriers made of a conducting material such as e.g., leadframes or TSLP carriers (Thin Small Leadless Package), or carriers made of a non-conductive material such as e.g., PCBs (Printed Circuit Boards), SBU (Sequential Build-Up) laminate substrates, ceramic substrates, plastic substrates, mold compounds, e.g., MIDs (Molded Interconnect Devices).

Embodiments of manufacturing a substrate having circuit interconnections may comprise substrates of different type and configuration, in particular substrates made on a basis of epoxy resin such as e.g., PCBs or SBU laminate substrates, substrates made of plastics such as polyethylenterephthalat or polyimid, ceramic substrates, mold compounds, e.g., MIDs, wafers or reconstituted wafers.

Embodiments of manufacturing a semiconductor device or a substrate having circuit interconnections may comprise forming a metallization layer. The metallization layer may be of any conductive material and, in particular, any metal material such as e.g., copper, aluminum etc.

In several embodiments dielectric layers are applied. It should be appreciated that any such terms as "applied" or "deposited" are meant to cover literally all kinds and techniques of applying dielectric layers. In particular, they are meant to cover techniques in which layers are applied at once as a whole like, for example, laminating techniques, spin-on techniques or molding as well as techniques in which layers are deposited in a sequential manner like, for example, CVD (Chemical Vapor Deposition) etc.

Figure 1:
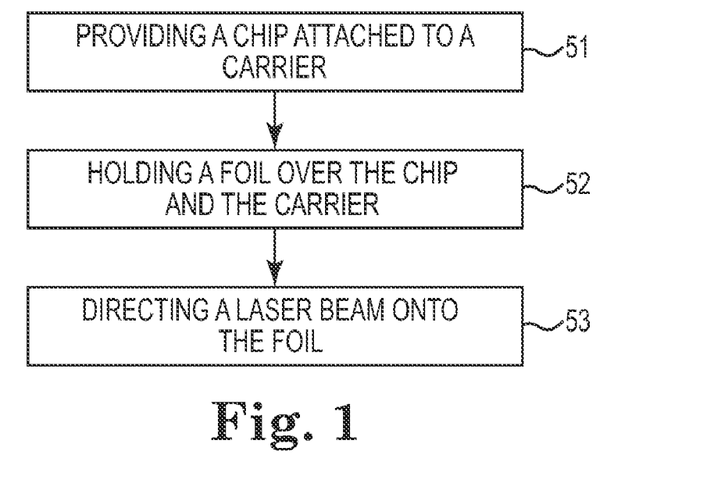
FIG. 1 is a flow diagram of one embodiment of a method of manufacturing a semiconductor device.
Figure 2:
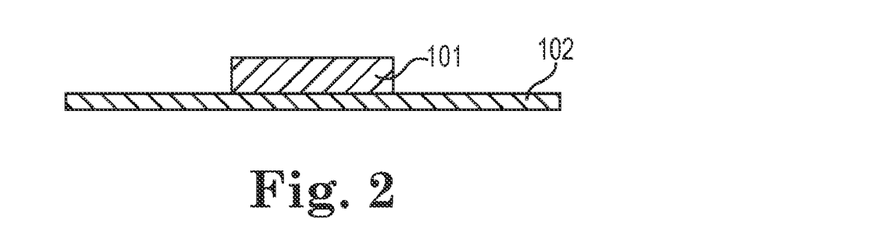
FIG. 2 is a schematic cross-sectional view of a chip attached to a carrier.
Figure 3:
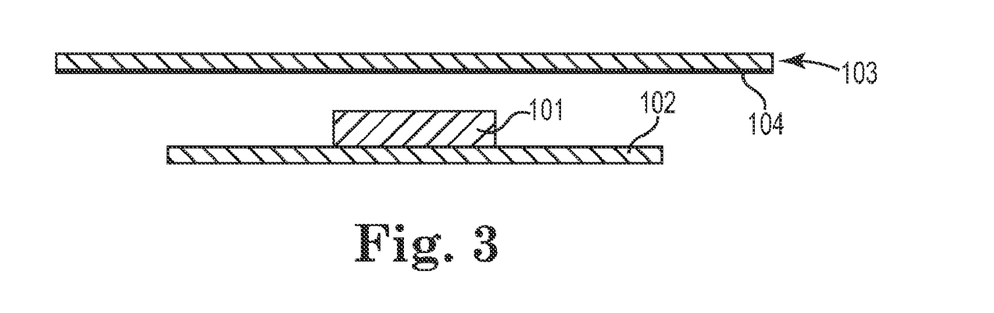
FIG. 3 is a schematic cross-sectional view of a foil held over the arrangement illustrated in FIG. 2.
Figure 4:
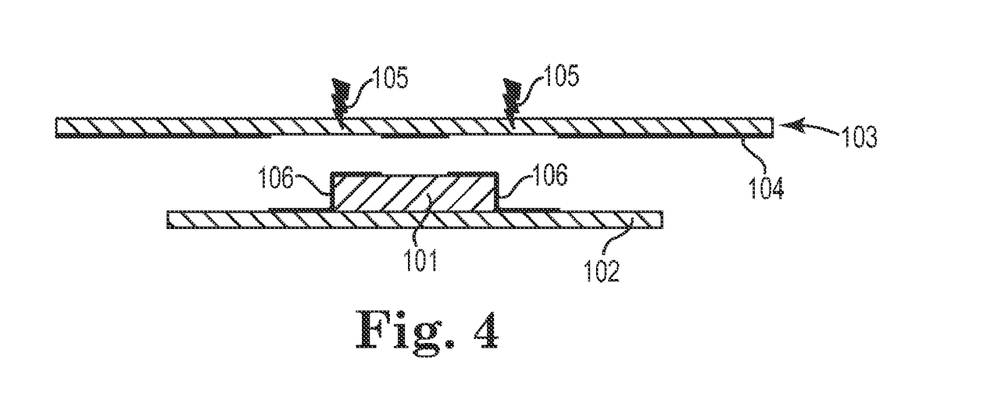
FIG. 4 is a schematic cross-sectional view illustrating the application of a laser beam to the foil illustrated in FIG. 3.
Figure 5:
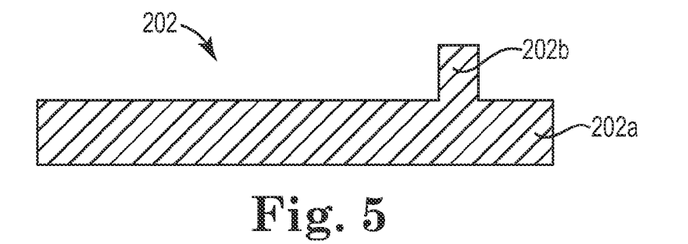
FIG. 5 is a schematic cross-sectional view of a carrier.

FIG. 1 in conjunction with FIGS. 2 to 4 illustrate method processes of one embodiment used for manufacturing a semiconductor device. In process S1, a chip 101 attached to a carrier 102 is provided. The chip 101 and the carrier 102 may each be of any kind as mentioned above. The semiconductor chip 101 may be covered with an electrically insulating layer such as a dielectric hard passivation layer or a dielectric layer (not illustrated).

In process S2, a foil 103 is held over the chip 101 and the carrier 102. The foil 103 may comprise or carry a substance 104 which is ablatable by laser beam interaction.

In process S3, a laser beam 105 is directed onto the foil 103. By virtue of laser beam application, the substance 104 is released from foil 103 where impacted by the laser beam 105 and deposited on the arrangement of chip 101 and carrier 102 at regions located opposite to the areas of the foil 103 which are impacted by the laser beam 105. That way, a structured layer 106 made of the substance 104 may be applied to the chip 101 and/or the carrier 102. As will be described in more detail further below, this structured layer 106 may determine the structure of a metallization layer to be generated later. In other words, the metallization layer (not illustrated) to be generated later may have the same shape as the structured layer 106. By way of example, the metallization layer (not illustrated) could be generated by using the structured layer 106 as a seed layer or by any other technique which allows for depositing, structuring or growing a metallization layer in conformity with the design of the structured layer 106.

It is to be noted that in this and other embodiments the transfer of the substance 104 to the target structure (here e.g., chip 101 and carrier 102) may be performed with high spatial accuracy. In practice, lateral resolutions down to about 20 μm or less of the structured layer 106 or of unstructured parts between parts of the structured layer 106 may be obtained. Thus, subsequent method processes using the structured layer 106 as a design pattern may take advantage of this high lateral resolution.

In this and other embodiments, the distance between foil 103 and the target structure 101, 102 may lie in a wide range, e.g., between 50 μm to 300 μm or more. Therefore, the method of patterning the target structure 101, 102 by foil assisted laser desorption is applicable to target structures having a large surface topology. For instance, in this and other embodiments, the height of the chip 101 over the carrier 102 or, more generally, the height of elevated parts of the target structure may e.g., be more than 50 μm, 100 μm or even 200 μm.

In this and other embodiments, laser beam application may be accomplished by directing the laser beam 105 to the backside of the foil 103. In one embodiment, the foil 103 may be made of a material which is transparent to the laser light. At the front side, the foil 103 may be coated with a coating material containing the substance 104. In this case, the laser beam may penetrate the foil 103 and directly interact with the coating material. For instance, the coating material may be made of a paste or matrix material and the substance 104 to be deposited on the target structure 101, 102 to form the structured layer 106. The paste or matrix material of the coating material may thermically interact with the laser light and release the substance 104 to form the structured layer 106 on the target structure 101, 102. Alternatively, the substance 104 may thermically interact with the laser beam and evaporate from the paste or matrix material. Other mechanisms for ablating the substance 104 from the foil 103 are equally possible. For instance, the substance 104 may be an integral constituent of the foil, and no coating material is needed. In this and other embodiments, the areas on the backside of the foil 103 which are hit by the laser beam may accurately conform to the ablated areas at the front side of the foil 103. Thus, the shape of the structured layer 106 on the target structure 101, 102 can be controlled by programming the path of the laser beam 105 on the backside of the foil 103. By sweeping or scanning the laser beam 105 along a predetermined path across a predetermined area on the backside of the foil 103, any arbitrary shape of the structured layer 106 may be applied to the target structure (here e.g., carrier 102 and semiconductor chip 101). Various types of lasers could be used. By way of example, a fiber laser having a wavelength of e.g., 1064 to 1100 nm (IR regime) could be employed. Other possibilities are to use a Nd:YAG laser, a $CO_2$-laser, an excimer-laser etc.

In this and other embodiments, the substance 104 may comprise a metal complex which may be contained in a solvent. A metal complex is a structure containing a central metal atom or molecule surrounded by ligands. As known in the art of chemistry, metal complexes with different types of ligands are available.

By way of example, the metal complex may be iron carbonyl. Iron carbonyl are compounds of iron and carbon monoxide, e.g., $Fe(CO)_5$, $Fe_2(CO)_9$ or $Fe_3(CO)_{12}$. Other ligands may also be possible. Further, the central atom or molecule of the metal complex must not be made of iron but may also be made of another metal such as e.g., nickel, etc.

In this and other embodiments, the coating material containing the substance 104 (or the substance itself) may be applied e.g., by rolling or another coating process to the front side surface of foil 103. The foil 103 coated with coating material may thus be manufactured in a cost-efficient manner. If e.g., iron carbonyl and a solvent is used as a coating material at the front side of the foil 103, iron carbonyl particles are ablated from the foil 103 by laser beam 105 interaction and the structured layer 106 is made of iron carbonyl. The ablated particles may mostly have a size of e.g., about 1 to 2 μm.

In this and other embodiments, after the application of the structured layer 106, the target structure 101, 102 may be subjected to galvanic or electroless metal plating using the structured layer 106 as a seed layer for metallization. By way of example, metal paths, circuit interconnections, metal lands etc. may be formed. In other embodiments, the structured layer 106 may serve as an auxiliary layer (or sacrificial layer) in order to generate another structured layer which may then serve as a seed layer for galvanic or electroless metal plating as described above. In this and other embodiments, by way of example, the target structure 101, 102 coated with the structured layer 106 may be immersed in a metal salt bath such as e.g., a copper salt bath. In this case, the central metal atom or molecule (e.g., iron) of the complex is substituted by a copper atom or molecule. In other words, the metal complex forming the structured layer 106 and having a first central metal atom or molecule is transformed into another metal complex having a second metal as a central atom or molecule. This second metal complex can then be used as a basis for metallization, e.g., as a seed layer for galvanic or electroless plating. Thus, by using one of the above-mentioned techniques, e.g., a copper metallization may be generated over a structured layer 106 made of a metal complex containing copper as a central atom or molecule, with the structured layer 106 either being directly ablated from the foil 103 or being generated by additional method processes from an auxiliary structured layer ablated from the foil 103.

In this and other embodiments, it is to be noted that the manufacturing process may comprise a number of further processes. By way of example, the structured layer 106 deposited on the target structure 101, 102 may be subjected to thermal processing after the deposition process. For instance, the target structure 101, 102 containing the structured layer 106 may be heated to about 60° C. for hardening the structured layer 106. That way, the adhesion and the stability of the structured layer 106 may be improved. Such curing of the structured layer 106 may also be accomplished at higher temperatures and may eventually result in an at least partial sintering of the metal carbonyl particles forming the structured layer 106.

Further, in this and other embodiments, before performing the deposition process, an undercoating could be applied to the surface of the target structure 101, 102 on which the structured layer 106 is to be applied. Using an undercoating may likewise improve the adhesion and/or stability of the structured layer 106 and may thus facilitate any further processing such as e.g., the substitution of the central metal atom or molecule of the deposited metal complex by another metal atom or molecule and/or the following metallization process. By way of example, siloxanes may be used as an undercoating and could be applied by any possible deposition technique such as e.g., CVD (Chemical Vapor Deposition), PVD (Physical Vapor Deposition) etc.

Further, in this and other embodiments, it is to be noted that an array of a plurality of target structures 101, 102 may be arranged under one foil 103 and could thus be processed within the same laser ablation process. For instance, an array of target structures 101, 102 may be placed beneath foil 103. In this case, the carriers 102 on which the chips 101 are mounted may still be interconnected or continuous during the laser ablation process. For example, each carrier 102 may be designed as a leadframe arranged in a stripe of interconnected leadframes, and the leadframes are singularized after the laser ablation process.

It is to be noted that the laser processing technique described above allows for a high degree of flexibility in view of device processing. For instance, different kinds of chips 101 may be processed and different kinds of structured layers 106 may be generated during one laser ablation process by simply programming the movement of the laser beam 105 in accordance with the different target structures 101, 102 beneath the foil 103. Further, in this and other embodiments, process reliability may be enhanced by using automated recognition systems adapted to align the control of the laser beam 105 to the actual placement of the target structures 101, 102 beneath the foil 103. In this case, optical recognition systems may provide for an optical measurement of the positions of the target structures 101, 102 e.g., through the transparent foil 103 and may further involve the computation of a correction of the laser beam control on the basis of the measured positions.

FIGS. 5 to 10 illustrate one embodiment of manufacturing a semiconductor device 200. According to FIG. 5, a carrier having a flat base part 202a and an integral elevated contact part 202b projecting from the base part 202a is provided. The carrier may be a metal carrier, e.g., a leadframe 202. The base part 202a may e.g., have a thickness of about 150 µm to 280 µm. The elevated contact part 202b may e.g., have a height of about 50 µm to 200 µm over the upper surface of the base part 202a.

Figure 6:
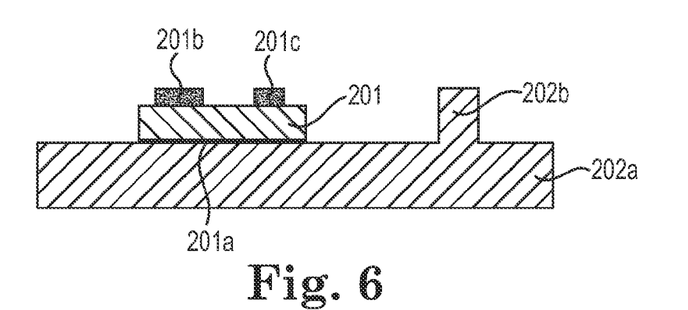
FIG. 6 is a schematic cross-sectional view of a chip attached to the carrier illustrated in FIG. 5.

As illustrated in FIG. 6, a semiconductor chip 201 is mounted on the base part 202a of the leadframe 202. The semiconductor chip 201 may e.g., be a power semiconductor transistor chip having a vertical structure. In this case, a drain contact 201a of the semiconductor chip 201 may be arranged at the bottom face of the semiconductor chip 201 and a source contact 201b as well as a gate contact 201c of the semiconductor chip 201 may be arranged at the top face of the semiconductor chip 201. The drain contact 201a may be fixed to the base part 202a of the leadframe 202 by soldering, e.g., diffusion soldering, conductive adhesive bonding or other technologies available in the art. The source and gate contacts 201b, 201c may be implemented by contact bumps including one or more metal layers and having a height of e.g., about 5 µm or 20 µm above the top face of the semiconductor chip 201. By way of example, the contact bumps may be made of a first lower layer of gold and a second upper layer of nickel. The level of the upper surface of the source and gate metal bumps may be equal to the level of the upper surface of the elevated contact part 202b. The above description may also be applied to bipolar transistor chips having a collector electrode, an emitter electrode and a base electrode instead of a drain electrode, a source electrode and a gate electrode, respectively.

In a following process, the semiconductor chip 201 may be encapsulated in an insulating polymer encapsulating material 210. The encapsulating material may be made of a dielectric material, on the basis of epoxy. The encapsulating material 210 may be applied by a dispensing, printing, immersion or molding process. A spin-on method may be used to distribute a dispensed liquid encapsulating material 210. Hardening of the encapsulating material 210 could be accomplished by a curing process. In particular, if a molding process is used, the technique of compression molding may be applied for encapsulation. The encapsulating material 210 may be filled by specific filler materials which may be added to the polymer material and could be used to control the physical characteristics of the encapsulating material 210 after hardening. Specially, the CTE (Coefficient of Thermal Expansion) could be controlled by the content of filler material in order to prevent chip damage or chip delamination during temperature cycles.

Figure 7:
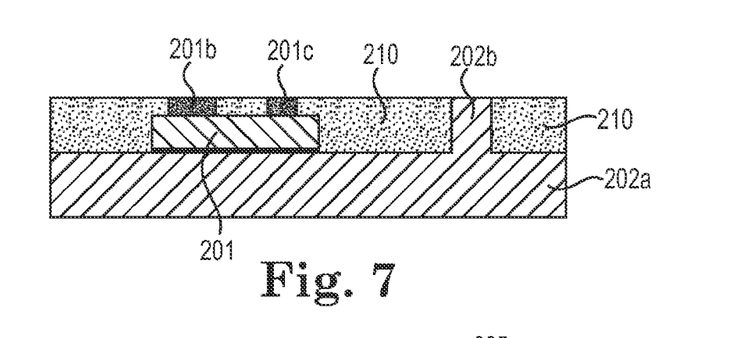
FIG. 7 is a schematic cross-sectional view of the arrangement illustrated in FIG. 6 after encapsulation in an encapsulating material.

As illustrated in FIG. 7, the semiconductor chip 201 may be completely embedded within the encapsulating material 210 except that the upper surfaces of the source and gate bumps 201b, 201c remain exposed. Further, the upper surface of the elevated contact part 202b of the leadframe 202 may remain exposed.

Figure 8:
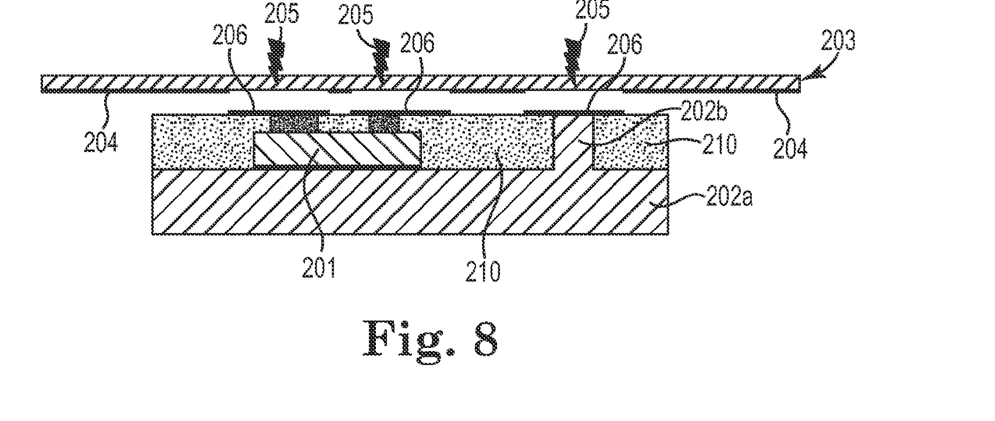
FIG. 8 is a schematic cross-sectional view illustrating the application of a laser beam to a foil held over the arrangement illustrated in FIG. 7.

As illustrated in FIG. 8, the arrangement of FIG. 7 is placed beneath a foil 203. The foil 203 may be similar to the foil 103 illustrated in FIGS. 3 and 4, i.e., may be provided with a substance 204 which may be identical to the substance 104 described above. Further, according to the above description, a laser beam 205 directed to the foil 203 and moved laterally with respect to the foil 203 allows to locally ablate and deposit the substance 204 onto the upper surface of the target structure, here the arrangement illustrated in FIG. 7. A structured layer 206 (corresponding to above-mentioned structured layer 106) is generated above the metal bump of the source contact 201b, the metal bump of the gate contact 201c and the elevated contact part 202b of the leadframe 202. The shape of the structured layer 206 may correspond to the shape of an electric redistribution structure to be generated in subsequent processing steps.

As already described in conjunction with FIG. 4, the structured layer 206 may be transformed to another structured layer 207 having the same shape but different composition. For instance, the structured layer 207 may include a copper complex which is generated by substituting an central atom or molecule of an iron complex contained in structured layer 206 by a central copper atom or molecule. To this end, the arrangement illustrated in FIG. 8 may be immersed for e.g., about 30 seconds in a copper salt bath. Other approaches of substituting the structured layer 206 by a structured layer 207 of different composition are also possible. The structured layer 207 may then be used as a seed layer for a subsequent metallization process. Further, as already mentioned, it is possible to skip the substitution process and to use the structured layer 206 directly as a seed layer for a subsequent metallization process.

In one embodiment, the metallization process may be accomplished by galvanic plating. In this case, the structured seed layer 207 is used as a cathode in a galvanic deposition process. To this end, the semiconductor device illustrated in FIG. 9 may be immersed in an electrolyte and a voltage may be applied between the carrier (e.g., leadframe 202) and the electrolyte. In that way, electro-plated copper accumulates on the structured layer 207 to form a structured plated metal layer 208. It is to be noted that either during the laser processing or at a later stage of the processing, insular parts of the structured layer 207 may be electrically connected to a part of the structured layer 207 which is electrically connected to the carrier (leadframe) 202. Such electrical connections could be removed after the galvanic plating process.

Figure 9:
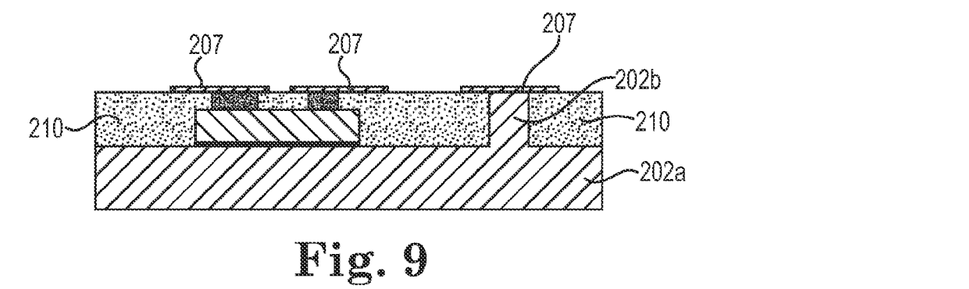
FIG. 9 is a schematic cross-sectional view illustrating the arrangement of FIG. 8 after a substitution process.

In one embodiment, the structured plated metal layer 208 may be generated by electroless plating. In this case, the structured seed layer 207 is made of a material which is suitable to act as a seed material in electroless plating. The semiconductor device illustrated in FIG. 9 is then immersed into an electroless plating metal bath.

Figure 10:
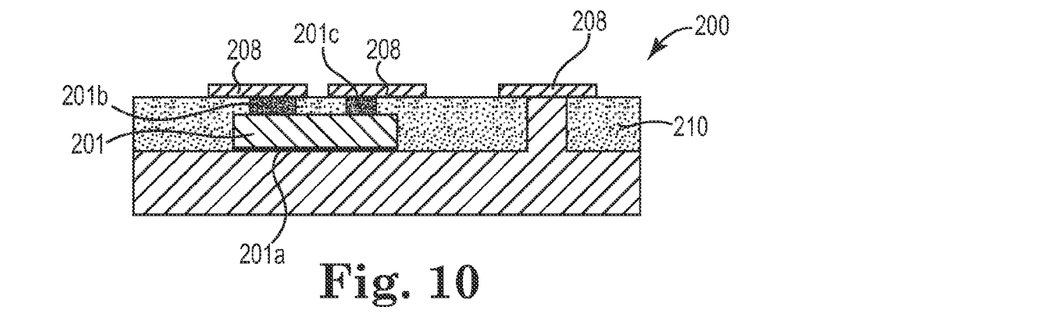
FIG. 10 is a schematic cross-sectional view illustrating a semiconductor device manufactured according to one embodiment of a method.

The thickness of the structured plated metal layer 208 may vary over a wide range depending on the application under consideration. For instance, a thickness of 2 µm to 10 µm may be appropriate for routing control signals such as signals fed to the gate or base of a transistor. On the other hand, the thickness of the structured metal layer 208 may be greater than 50 µm or even be greater than 100 µm or 150 µm, especially if drain (collector) or source (emitter) contacts of power transistors are contacted. After the metallization process, semiconductor devices 200 may be singularized by dicing the interconnected or continuous carrier 202 (leadframe) and the encapsulating material 210 to obtain single semiconductor devices 200 as illustrated in FIG. 10.

FIGS. 11 to 15 illustrate one embodiment of a method of manufacturing a semiconductor device 300. A carrier 302 may be placed on a temporary carrier 320. The carrier 302 may be made of a conductive material such as e.g., metal and may e.g., be a leadframe. However, other carriers as described above are also possible. If made of a conducting material, the carrier 302 may be provided with trenches 302a and 302b which separate the carrier 302 in electrically disconnected or insular sections 302a, 302b and 302c. A semiconductor chip 301 may be mounted on carrier section 302b. By way of example, the semiconductor chip 301 may be a vertical power semiconductor chip containing a power transistor. In this case, the semiconductor chip 301 may be attached with its bottom (or backside) drain contact (301a) to carrier section 302b.

Figure 11:
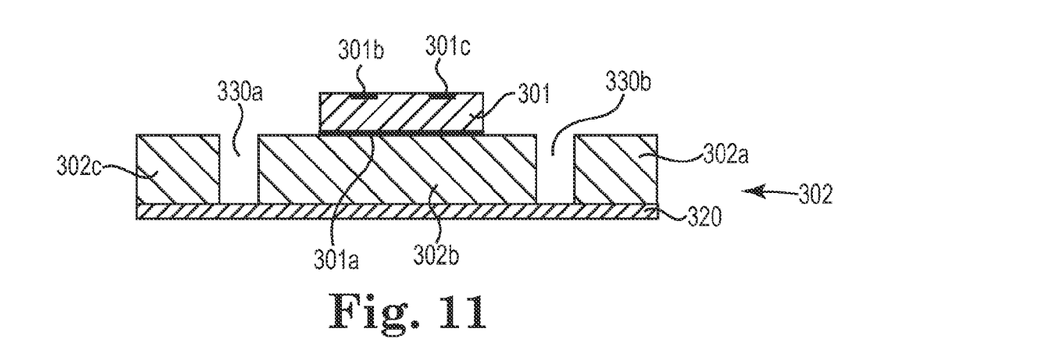
FIG. 11 is a schematic cross-sectional view of a chip attached to a carrier according to one embodiment.

On its top (or front) side, the semiconductor chip 301 may be equipped with a source contact 301b and a gate contact 301c. Again, the semiconductor chip may have a height of about 50 μm to 200 μm above the upper surface of the carrier section 302b.

Figure 12:
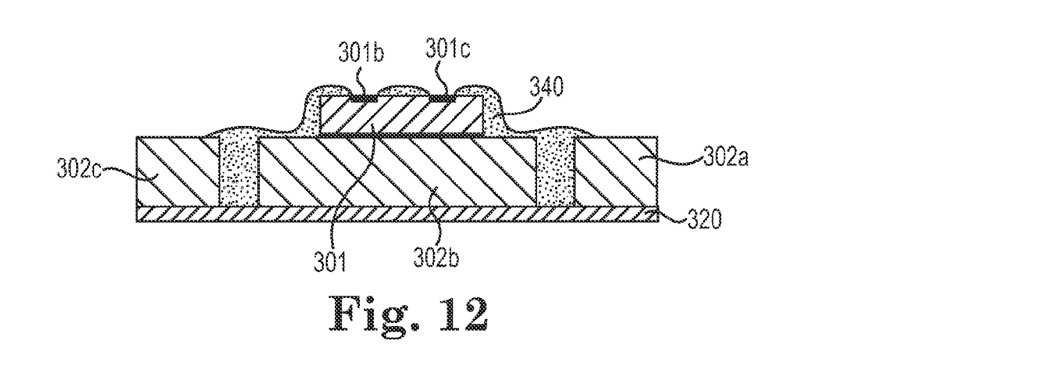
FIG. 12 is a schematic cross-sectional view of the arrangement illustrated in FIG. 11 after application of a dielectric.

Then, a structured insulating layer 340 of dielectric material is deposited on parts of the semiconductor chip 301 and on parts of the carrier 302, cf. FIG. 12. On the semiconductor chip 301, the dielectric material is deposited such that the chip contacts 301b and 301c remain exposed. On the other hand, the insulating layer 340 of dielectric material may cover the side faces of the semiconductor chip 301, the upper surface of the carrier section 302b and may fill the trenches 330a and 330b. The dielectric material may be applied by a substantially additive process such as e.g., dispensing or printing. By way of example, printing may be carried out as a stencil print process, a screen print process or an ink-jet printing process. In a stencil print process or a screen print process, the desired position and shape of the dielectric material are mapped to form openings of the stencil or screen through which the liquid dielectric material is applied. In ink jet printing, an ink jet nozzle is used to discharge liquid dielectric material to form the insulating layer 340. In both printing and in dispensing processes, the fineness of the printed or dispensed structures may be controlled by properties of the dielectric material (e.g., viscosity) and both these processes allow for generating structures having dimensions of down to a few μm.

Figure 13:
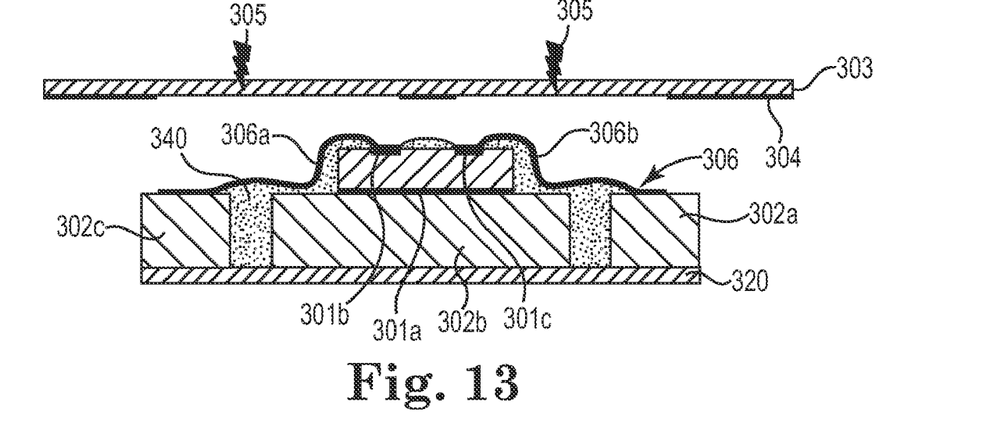
FIG. 13 is a schematic cross-sectional view illustrating the application of a laser beam to a foil held over the arrangement illustrated in FIG. 12.

Then, as illustrated in FIG. 13, the laser beam 305 is directed to foil 303 and the ablation process is performed. To this end, as already described before, a foil 303 provided with substance 304 (which is possibly contained in a coating material covering the foil 303) is impacted by the laser beam 305 and e.g., particles of the substance 304 are "shot" on the target device. That way, the structured layer 306 may be generated over the target device by the ablated substance 304. One part 306a of the structured layer 306 connects to carrier section 302c and extends over the insulating layer 340 to connect to chip contact 301b. Another section 306b of the structured layer 306 contacts to the carrier section 302a, extends over the insulating layer 340 and connects to the chip contact 301c.

Figure 14:
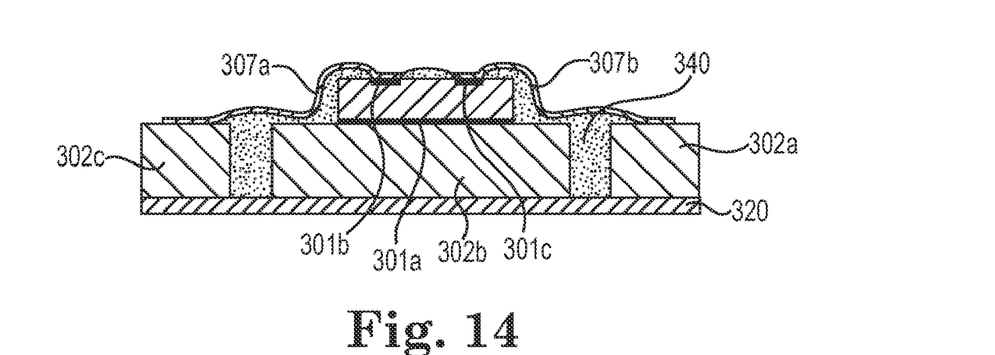
FIG. 14 is a schematic cross-sectional view illustrating the arrangement of FIG. 13 after a substitution process.

The structured layer 306 will then be transformed in or replace by a structured seed layer 307 having e.g., a first seed layer section 307a and a second seed layer section 307b corresponding to sections 306a and 306b, respectively, of the structured layer 306. The transformation or replacement of the structured layer 306 has been described before and may be omitted if the structured layer 306 itself has the ability to act as a seed layer in a subsequent metallization process (FIG. 14).

Figure 15:
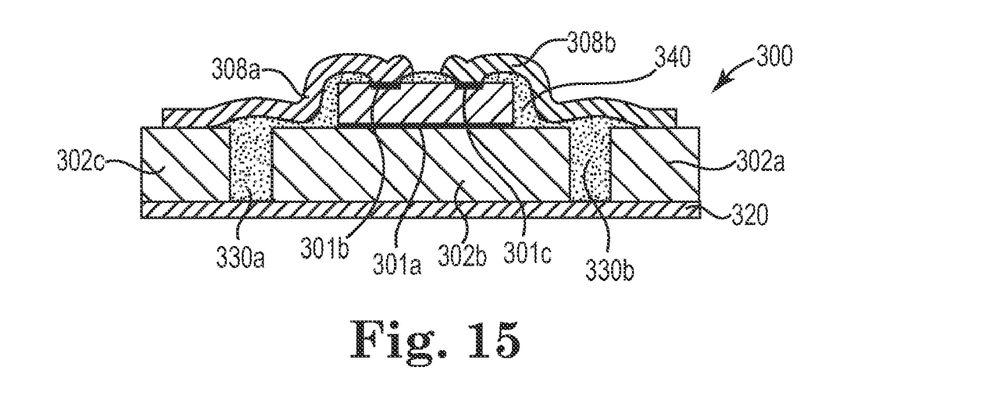
FIG. 15 is a schematic cross-sectional view illustrating a semiconductor device manufactured according to one embodiment of a method.

FIG. 15 illustrates the semiconductor device 300 after metallization. During metallization, a structured metal layer 308 is generated above the structured seed layer 307 by an additive metallization process as described above. One part 308b of the metal layer 300 is arranged to electrically connect gate contact 301c of the semiconductor chip 301 to carrier section 302a. Carrier section 302a is electrically isolated from carrier section 302b by the dielectric material filling the trench 300b and serves as a gate terminal of the semiconductor device 300. Part 308a of the metal layer 308 is arranged to electrically connect the source contact 301b of the semiconductor chip 301 to the section 302c of carrier 302. Carrier section 302c is electrically isolated from section 302b of the carrier 302 and serves as a source terminal of the semiconductor device 300. Section 302b of carrier 302 serves as a drain terminal of semiconductor device 300.

Again, an array of a plurality of semiconductor devices 300 arranged on interconnected leadframes 302 and on a common temporary carrier 320 may be processed. After the metallization process, semiconductor devices 300 may be separated from each other by appropriate separation techniques (e.g., sawing, laser dicing etc.) and the temporary carrier 320 will be removed.

FIGS. 16 through 24 illustrate processes in one embodiment of a method of fabrication a semiconductor device 400 using the TSLP technology. According to FIG. 16, a carrier 402 is arranged on a sacrificial plate 420 made e.g., of copper. On this plate 420, contact pads 402a, 402b, 402c are placed using e.g., photo-lithographic processes. When photo-lithographic processes are used to generate the contact pads 402a, 402b, 402c, a photoresist layer is structured to expose the sacrificial plate 420 at the areas where the contact pads 402a, 402b, 402c are to be generated. Alternatively, polymer material 450 may be applied in a structured fashion onto the sacrificial plate 420. This may be accomplished by using a printing (e.g., screen, stencil or ink jet printing) process or a dispensing process. The polymer material 450 exposes the sacrificial plate 420 at the areas where the contact pads 402a, 402b, 402c are to be generated. Filled or unfilled polymer materials such as polyimide or epoxy resin may be used.

In both cases, the contact pads 402a, 402b, 402c may be generated on the sacrificial plate 420 by a galvanic process. The contact pads 402a, 402b, 402c may e.g., be made from nickel and have a thin gold or silver layer on top. It is to be noted that after removing the sacrificial plate 420 (cf. FIG. 24), the polymer material 450 may remain in between the contact pads 402a, 402b, 402c or may be removed and substituted by another insulating material.

Figure 16:
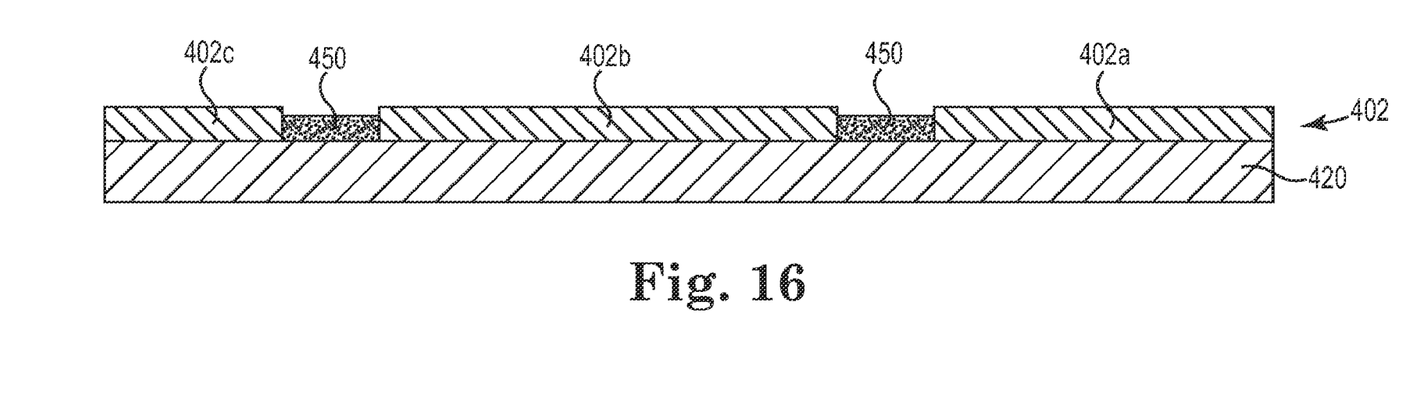
FIGS. 16 through 24 are cross-sectional views illustrating fabrication processes of a semiconductor device according to one embodiment of a method.

Compared to conventional leadframe techniques, in which leads or contact pads are structured by punching or etching, the structuring method described above allows for a considerably higher packaging density, i.e., for a higher number of contact pads 402a, 402b, 402c for a package of given dimensions. As a difference to conventional leadframe techniques, the contact pads 402a, 402b, 402c may be insular, whereas in conventional leadframe technique, each contact pad or lead has to be suspended at the frame structure of the leadframe.

Figure 17:
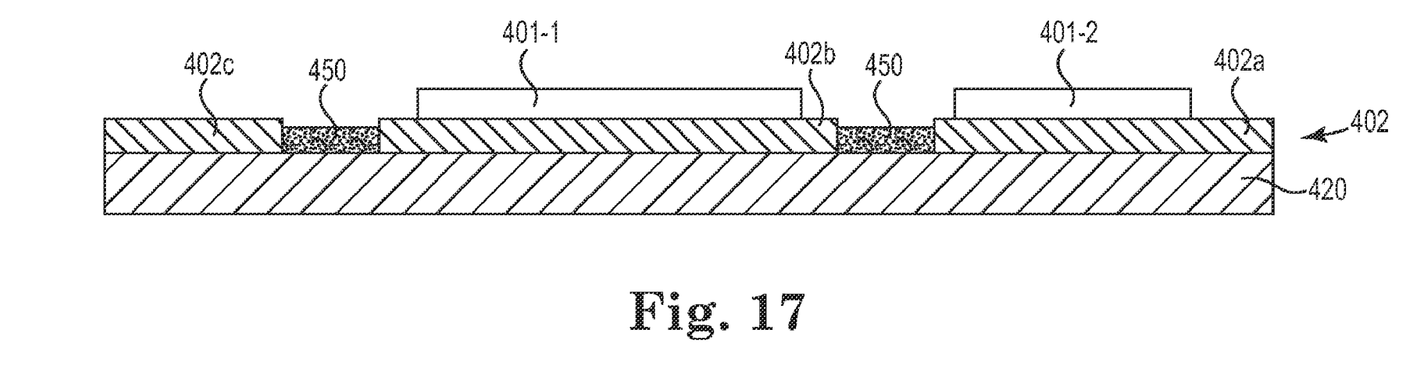

In FIG. 17, semiconductor chips 401-1, 401-2 are then attached to contact pads 402b, 402a, respectively. This process is also referred to in the art as die attach. By way of example, the semiconductor chip 401-1 may be a power semiconductor chip and the semiconductor chip 401-2 may be a logic semiconductor chip. These components may be attached to the contact pads 402b, 402a, respectively, in an electrically conductive or insulated fashion, for instance by soldering or adhesive bonding.

Figure 18:
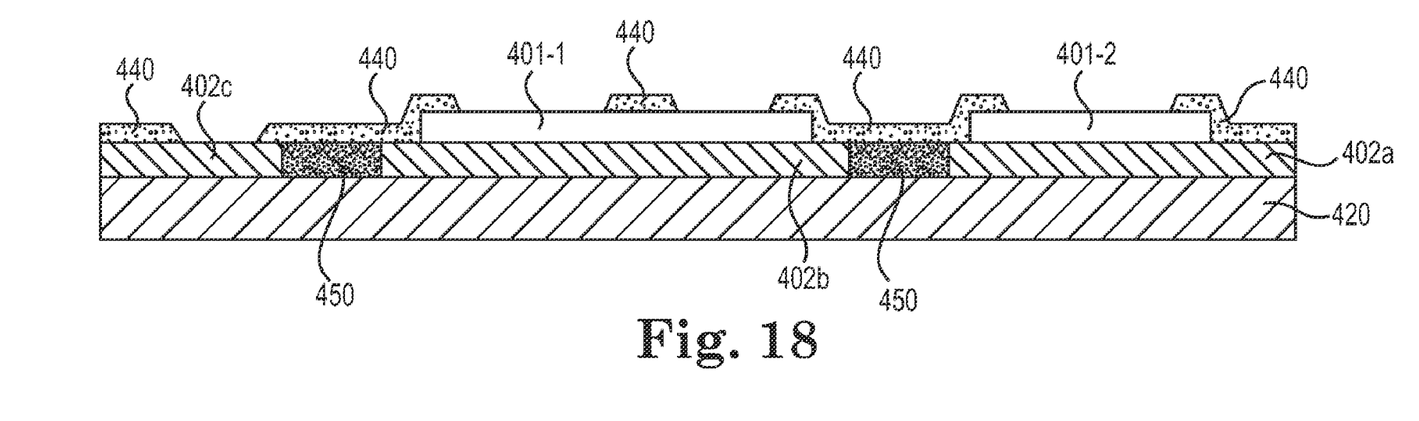

FIG. 18 illustrates the generation of a structured insulating layer 440. The structured insulating layer 440 may be applied to cover a zone between the power semiconductor chip 401-1 and the logic semiconductor chip 401-2 as well as to cover a zone between the power semiconductor chip 401-1 and the contact pad 402c. The application of the insulating layer 440 may be accomplished according to the description related to the application of the insulating layer 340 in FIG. 12. Thus, the insulating layer 440 may either be deposited to cover the whole structure and may then be structured by photo-lithographic processes or may be applied in an additive process by using dispensing or printing techniques. To avoid reiteration, reference is made to the aforementioned description. Vertical structures such as side faces of the semiconductor chips 401-

1, 401-2 may be printed by tilting either the carrier 402 or the printing head of the printing device.

Then, parts 407a and 407b of a structured seed layer 407 are generated onto the semiconductor chips 401-1, 402-2 and over the contact pads 402a, 402b, 402c. As apparent from FIG. 19, the parts 407a and 407b of the structured seed layer 407 are insulated against the contact pads 402a, 402b by the structured insulating layer 440, whereas the part 407b of the structured seed layer 407 is made to be in electrical contact with the contact pad 402c. Thus, contact pad 402c forms a conducting line post.

Figure 19:
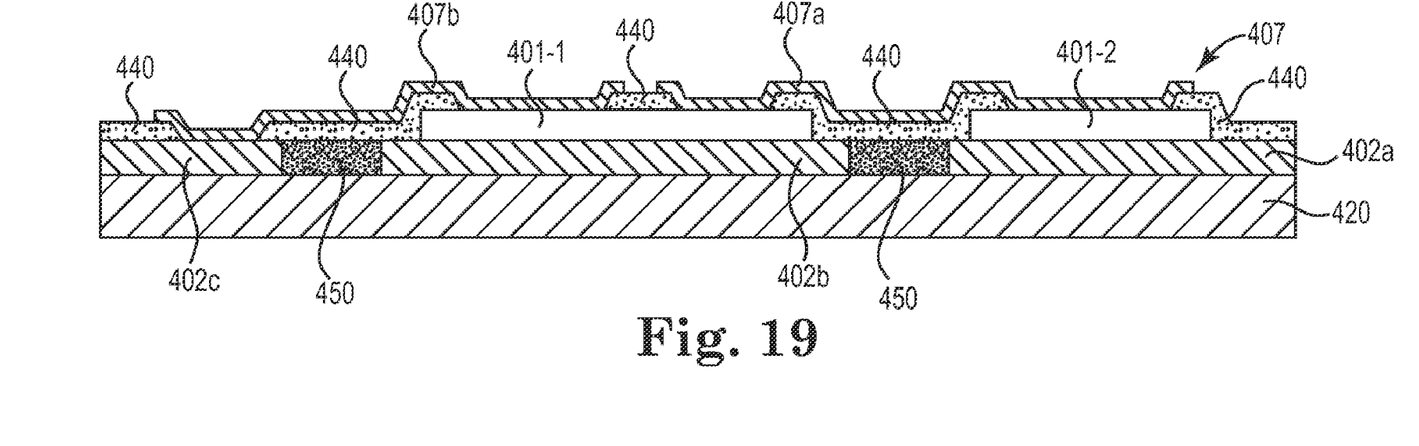

The process to generate the parts 407a, 407b of the structured seed layer 407 by laser ablation and optional substitution and/or replacement of the ablated material has been described earlier. To avoid reiteration, reference is made to this description.

Figure 20:
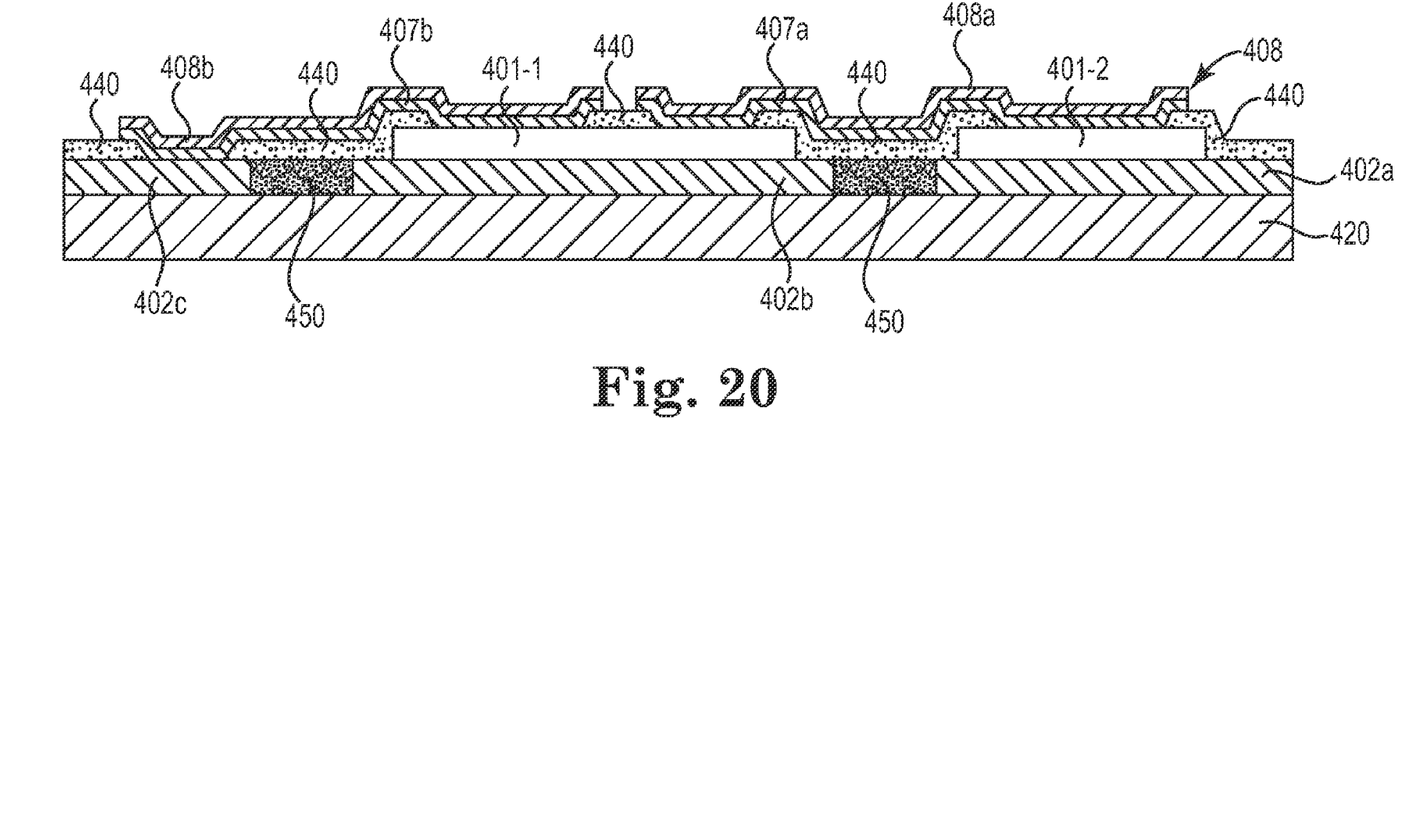

Then, as illustrated in FIG. 20, a part 408a of a metal layer 408 is generated over the part 407a of the structured seed layer 407 and a part 408b of a metal layer 408 is generated over the part 407b of the structured seed layer 407. Any method of metallization (e.g., electroless or galvanic plating) as described above may be used.

Figure 21:
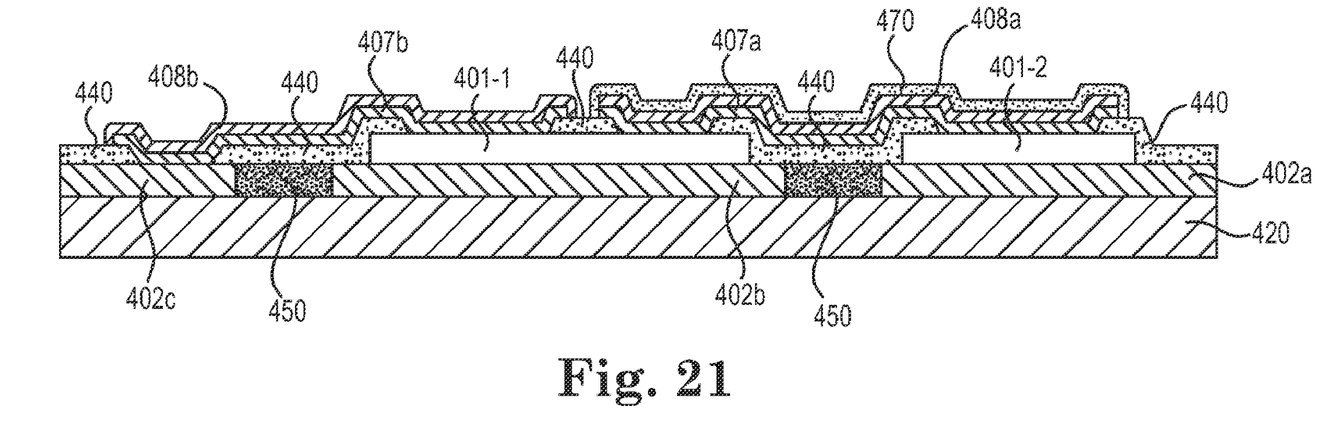

In a later process, a protection layer 470 may be deposited to cover the upper surface of part 407a of the structured seed layer 407, see FIG. 21. The part 407a of the structured seed layer 407 may interconnect the gate of the power semiconductor chip 401-1 to a chip contact of the logic semiconductor chip 401-2. As only low currents will pass this conducting line, a small thickness thereof in accordance with the values outlined further above, e.g., 2 to 10 µm, may prove sufficient. The application of the protection layer 470 may be accomplished by photolithography and etching or mask-free additive techniques such as e.g., printing or dispensing.

Figure 22:
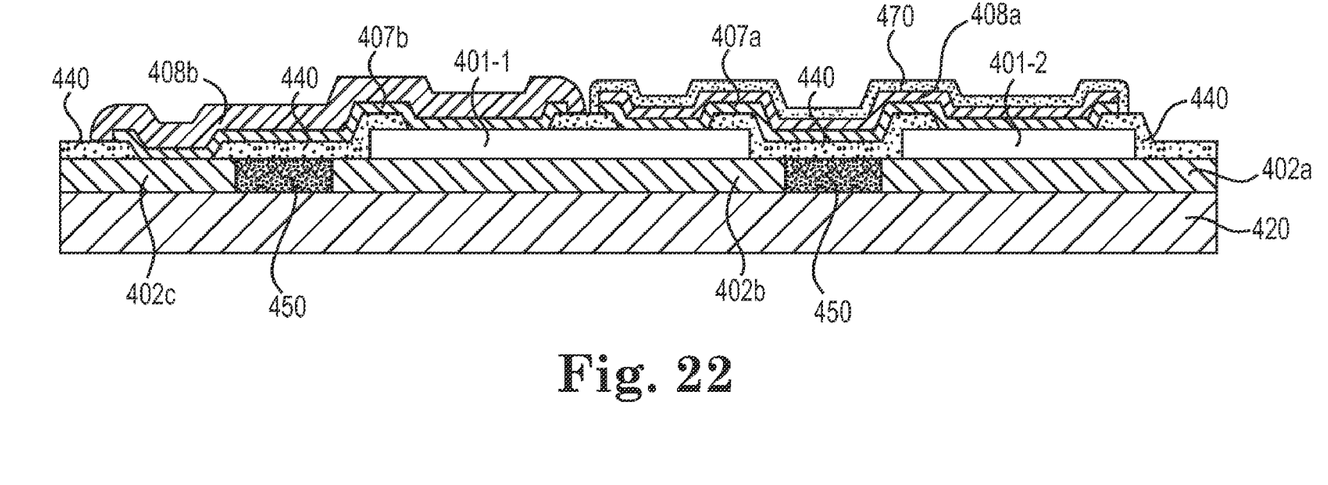

In a subsequent process, the part 408b of the structured metal layer 408 is reinforced e.g., by using galvanic or electroless plating as explained above (FIG. 22). The protection layer 470 acts as a barrier to prevent metal (e.g., copper) to grow on the part 408a of the structured metal layer 408. Thus, the finished part 408b of the structured metal layer 408 is composed of a first base part which is deposited before the application of the protection layer 470 and may have substantially the same thickness as the part 408b of the structured metal layer 408, and a second upper part, which is deposited after the application of the protection layer 470 and reinforces the base part to obtain a thickness which is substantially greater than the thickness of the part 408a. The methods to deposit the base part and the upper part of the part 408b of the structured metal layer 408 may for instance be different, e.g., electroless plating and galvanic plating, respectively.

Figure 23:
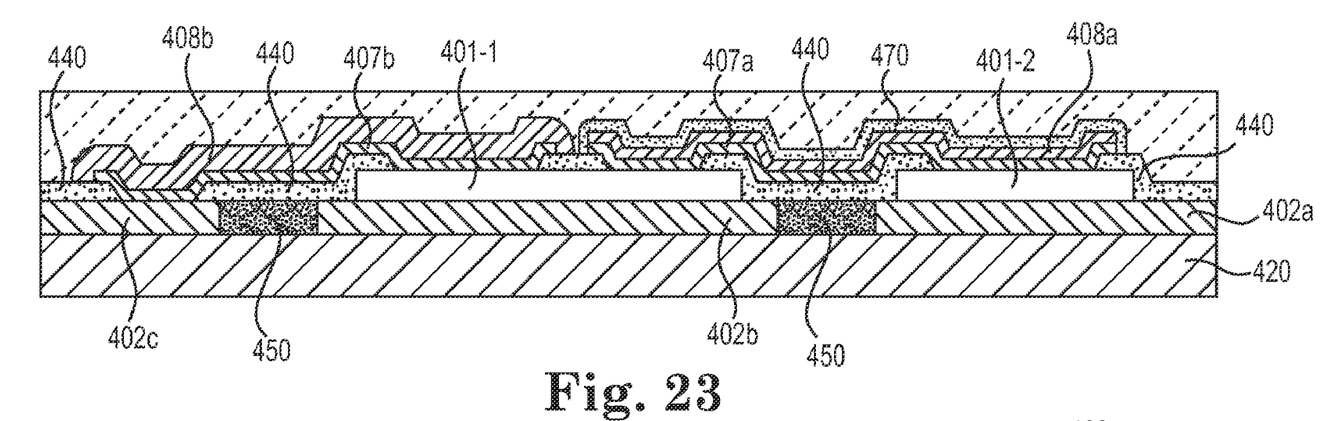

As illustrated in FIG. 23, the semiconductor device 400 may be equipped with an encapsulating material 410. The encapsulating material 410 is applied to the top side of the semiconductor device 400 leaving the bottom side of the sacrificial plate 420 uncovered.

Figure 24:
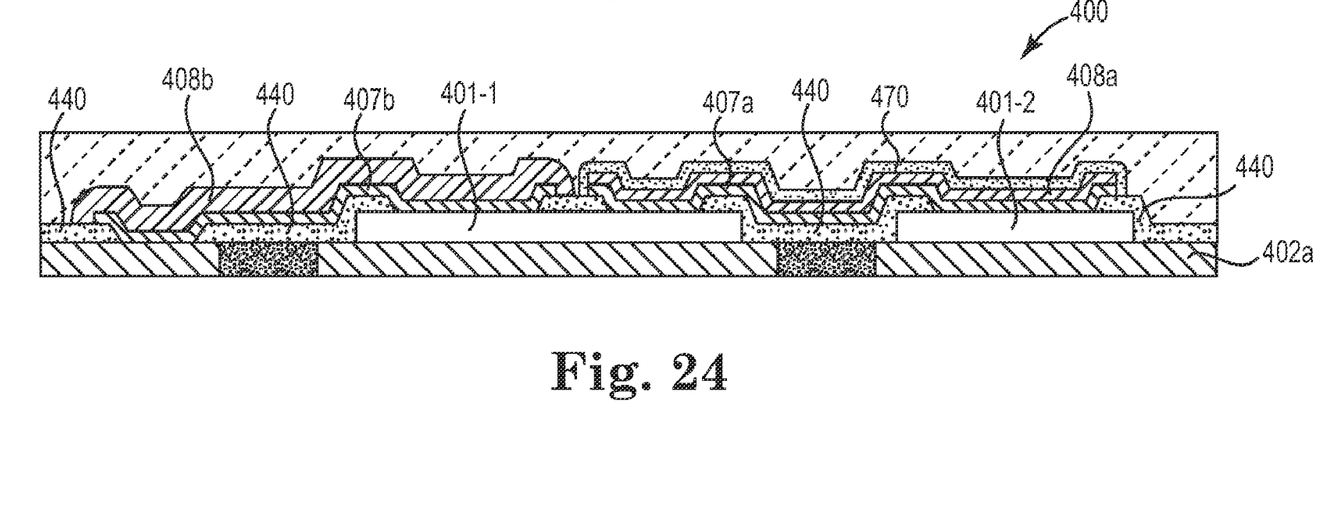

Then, the sacrificial plate 420 is removed e.g., by a selective chemical wet etching procedure, cf. FIG. 24. That way, the carrier 402 of the semiconductor device 400 is formed by the metallic contact pads 402a, 402b, 402c spaced apart and electrically insulated to each other by polymer material 450. After removing the sacrificial plate 420, the bottom faces of the contact pads 402a, 402b, 402c may e.g., be coated by an electroless deposition of nickel and gold.

Figure 25:
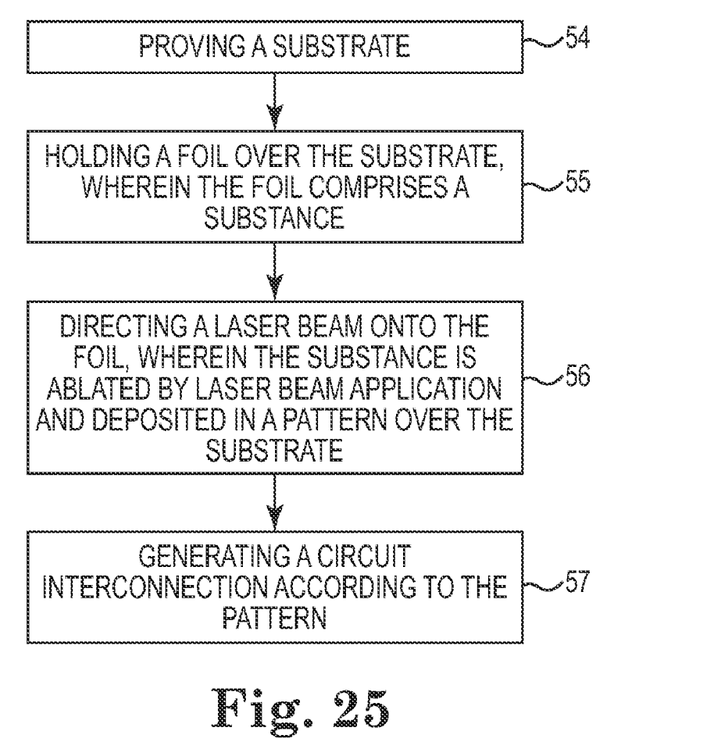
FIG. 25 is a flow diagram of one embodiment of a method of manufacturing a semiconductor device.
Figure 26:
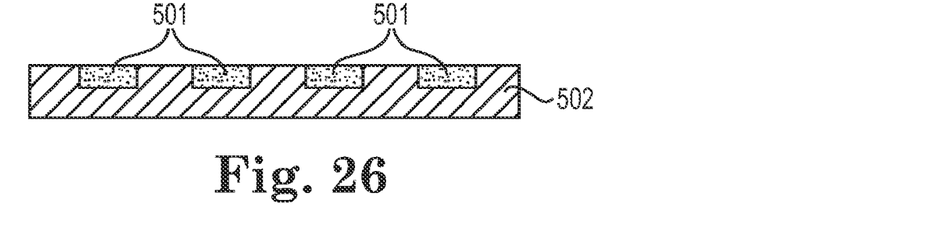
FIG. 26 is a schematic cross-sectional view of a substrate.

FIG. 25 in conjunction with FIGS. 26 to 29 illustrate one embodiment of a method of manufacturing a substrate 500 having circuit interconnections. In process S4, a substrate 502 is provided (FIG. 26). Various kinds of substrates may be used. By way of example, substrate 502 may be a molded body accommodating a plurality of semiconductor chips 501. Such molded bodies accommodating a plurality of spaced-apart redistributed semiconductor chips 501 are often termed "molded reconstituted wafer" in the art. They are used in embedded device wafer level packaging (eWLP) technology. In eWLP technology, the front-end processed and probed wafer is first singulated to obtain single chips. Then, the chips are placed onto a support in a spaced-apart relationship and are molded e.g., by using an electrically insulating liquid molding material that is dispensed over the chips 501. The molding material may be of any appropriate thermoplastic or thermosetting material. It may be a resin, e.g., an epoxy-based material, a photoresist etc. Various techniques may be employed to cover the semiconductor chips 501 with the molding material, e.g., compression molding or injection molding. After curing, the molded body made of the molding material provides a rigid structure accommodating a plurality (e.g., typically more than 50) semiconductor chips 501. The molded body may have a shape of a disc or plate which may have a lateral dimension of more than 0.2 or even 0.3 m.

Figure 27:
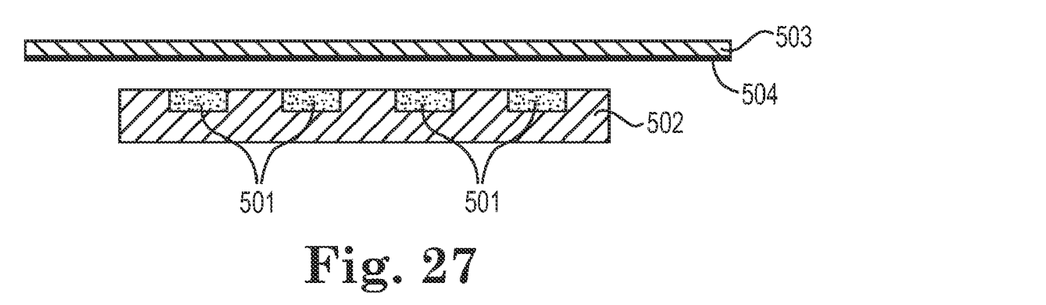
FIG. 27 is a schematic cross-sectional view of a foil held over the substrate illustrated in FIG. 26.

In process S5, a foil 503 is held over the substrate 502, wherein the foil includes or carries a substance 504 (FIG. 27). In this connection, in order to avoid reiteration, reference is made to the earlier description.

Figure 28:
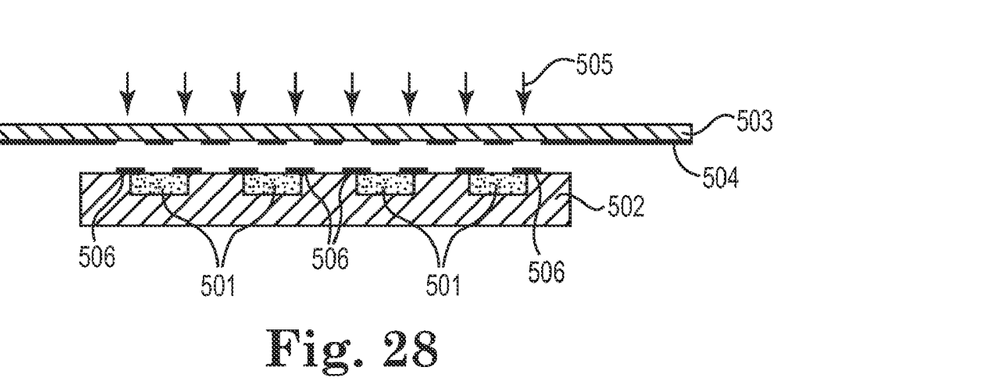
FIG. 28 is a schematic cross-sectional view illustrating the application of a laser beam to the foil illustrated in FIG. 27.

In process S6 illustrated in FIG. 28, a laser beam 505 is directed onto the backside of the foil 503, whereby the substance 504 is ablated by laser beam interaction and deposited in a pattern over the substrate 502. Again, as described earlier, the pattern of the structured layer 506 deposited on the substrate 502 may be controlled with high accuracy by controlling the path of the laser beam 505 over the backside of foil 503.

Figure 29:
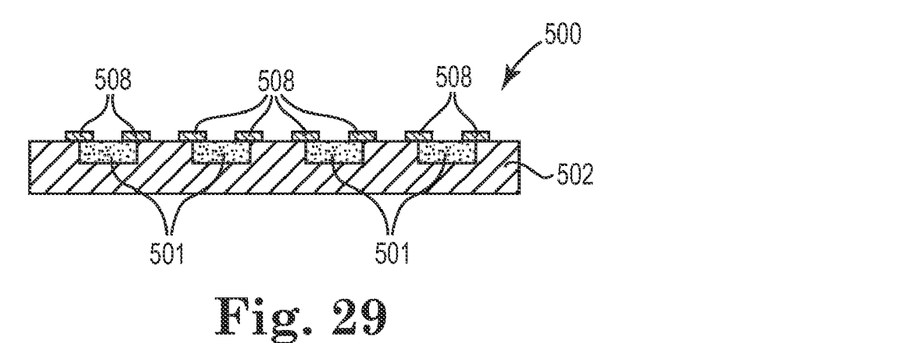
FIG. 29 is a schematic cross-sectional view illustrating a substrate manufactured according to one embodiment of a method.

Then, in process S7, circuit interconnections 508 are generated over the substrate 502 in conformity to the pattern of the structured layer 506 (See, e.g., FIG. 29). The circuit interconnection 508 may represent a structured electric redistribution layer which may be used to manufacture "fan-out" devices. In fan-out devices, the conductive redistribution structure extends in a lateral direction beyond the outline of the semiconductor chip 501. Thus, the molding material embedding the semiconductor chips 501 allows to enlarge the footprint of semiconductor devices to be manufactured from the molded reconstituted wafer (i.e., substrate 502). To this end, after process S7, the molded reconstituted wafer is diced into single devices (e.g., by sawing or laser dicing).

It is to be noted that various different kinds of substrates 502 may be used. In one embodiment, as may be used in WLB (wafer level packaging) technology, the substrate may be a wafer. In another embodiment, the substrate 502 may be a carrier for mounting an electronic circuit, e.g., a PCB or a SBU laminate substrate. PCBs are typically composed of one or more glass fiber-reinforced epoxy resin layers. Layers of fluoro-polymer material such as e.g., polytetrafluoroethylen, aramid fibers or carbon fibers may also be used. SBU laminate substrates comprise of a number of core layers and built-up layers covering the core layers at both sides of the core. The design of the core layers is similar to the design of a conventional PCB. The built-up layers may be made of a dielectric material, e.g., silica-filled epoxies, and are plated by metal layers. These metal layers within the built-up layers are structured and serve to provide an carrier-internal interconnect.

Further, in one embodiment, the substrate 502 may comprise a layer made of polyethylenterephthalat or polyimid. By way of example, the substrate 502 may be a chip card made of one or more of these materials.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device comprising:
   providing a chip attached to a carrier;
   holding a foil over the chip and the carrier; and
   directing a laser beam onto the foil over the chip and the carrier,
   wherein the foil comprises a substance ablatable by laser beam application.

2. The method of claim 1, wherein the substance comprises a first metal.

3. The method of claim 2, wherein the first metal is contained in the substance as a first metal complex compound.

4. The method of claim 2, wherein the first metal is at least one of iron and nickel.

5. The method of claim 1, further comprising:
   depositing the substance over the chip and the carrier by laser beam ablation.

6. The method of claim 5, further comprising:
   substituting the deposited substance or a constituent of the deposited substance by a second metal.

7. The method of claim 6, further comprising:
   forming a metallization layer on an area covered by the second metal.

8. A method of manufacturing a semiconductor device comprising:
   providing a chip attached to a carrier;
   holding a foil over the chip and the carrier; and
   directing a laser beam onto the foil over the chip and the carrier,
   wherein directing a laser beam onto the foil includes moving the laser beam over the foil laterally with respect to the foil.

9. A method of manufacturing a semiconductor device comprising:
   providing a chip attached to a carrier;
   holding a foil over the chip and the carrier; and
   directing a laser beam onto the foil over the chip and the carrier,
   wherein the chip includes a first electrode on a first main face of the chip and a second and a third electrode on a second main face of the chip opposite to the first main face, and
   wherein the laser beam is laterally moved over the foil to a position over at least one of the second electrode and the third electrode.

10. A method of manufacturing a semiconductor device comprising:
    providing a chip attached to a carrier;
    holding a foil over the chip and the carrier;
    directing a laser beam onto the foil over the chip and the carrier; and
    immersing the semiconductor device in an electrolyte.

11. The method of claim 10, further comprising:
    applying a voltage between the carrier and the electrolyte.

12. A method of manufacturing a substrate having circuit interconnections, comprising:
    providing a substrate;
    holding a foil over the substrate, wherein the foil comprises a substance;
    directing a laser beam onto the foil, wherein the substance is ablated by laser beam application and deposited in a pattern over the substrate; and
    generating a circuit interconnection according to the pattern.

13. The method of claim 12, wherein the substance comprises a first metal.

14. The method of claim 13, wherein the first metal is contained in the substance as a first metal complex compound.

15. The method of claim 12, further comprising:
    substituting the deposited substance or a constituent of the deposited substance by a second metal.

16. The method of claim 12, wherein the substrate is a semiconductor wafer.

17. The method of claim 12, wherein the substrate is a molded body accommodating a plurality of semiconductor chips.

18. The method of claim 12, wherein the substrate comprises a layer made of epoxy resin.

19. The method of claim 12, wherein the substrate comprises a layer made of polyethylenterephthalat or polyimid.

* * * * *